(12) United States Patent
Tu et al.

(10) Patent No.: US 12,727,504 B2
(45) Date of Patent: Sep. 1, 2026

(54) SEMICONDUCTOR STRUCTURE

(71) Applicant: WIN SEMICONDUCTORS CORP., Taoyuan City (TW)

(72) Inventors: Shao-Yu Tu, Taoyuan City (TW); She-Hsin Hsiao, Taoyuan City (TW); Jung-Tao Chung, Taoyuan City (TW)

(73) Assignee: WIN SEMICONDUCTORS CORP., Taoyuan City (TW)

( * ) Notice: Subject to any disclaimer, the term of this patent is extended or adjusted under 35 U.S.C. 154(b) by 447 days.

(21) Appl. No.: 18/528,947

(22) Filed: Dec. 5, 2023

(65) Prior Publication Data

US 2025/0183205 A1 Jun. 5, 2025

(51) Int. Cl.
*H10W 72/90* (2026.01)
*H10W 72/20* (2026.01)
*H10W 72/29* (2026.01)

(52) U.S. Cl.
CPC .......... *H10W 72/90* (2026.01); *H10W 72/20* (2026.01); *H10W 72/221* (2026.01); *H10W 72/232* (2026.01); *H10W 72/252* (2026.01); *H10W 72/29* (2026.01); *H10W 72/923* (2026.01); *H10W 72/932* (2026.01); *H10W 72/934* (2026.01); *H10W 72/9415* (2026.01); *H10W 72/952* (2026.01)

(58) Field of Classification Search
CPC ... H10W 72/90; H10W 72/20; H10W 72/221; H10W 72/232; H10W 72/252; H10W 72/29; H10W 72/923; H10W 72/932; H10W 72/934; H10W 72/9415; H10W 72/952; H10W 70/65; H10W 72/00; H10W 90/701; H10W 90/00
See application file for complete search history.

(56) References Cited

U.S. PATENT DOCUMENTS

| | | | | |
|---|---|---|---|---|
| 5,734,193 | A | 3/1998 | Bayraktaroglu | |
| 6,559,534 | B1 | 5/2003 | Floriot | |
| 9,653,586 | B2 | 5/2017 | Dungan | |
| 10,332,805 | B2 | 6/2019 | Dungan | |
| 10,847,436 | B2 | 11/2020 | Kondo | |
| 11,469,187 | B2 * | 10/2022 | Tokuya | H10W 20/484 |

(Continued)

FOREIGN PATENT DOCUMENTS

| | | | |
|---|---|---|---|
| TW | 202115904 | A | 4/2021 |
| WO | 2015104967 | A1 | 7/2015 |

OTHER PUBLICATIONS

Chinese language office action dated Feb. 11, 2025, issued in application No. TW 113117936.

*Primary Examiner* — Jonathan Han
(74) *Attorney, Agent, or Firm* — McClure, Qualey & Rodack, LLP

(57) ABSTRACT

A semiconductor structure includes heterojunction bipolar transistors arranged in parallel and disposed on a substrate. The semiconductor structure also includes a landing structure disposed at the edge of the HBTs on the substrate. The semiconductor structure also includes wiring disposed on the HBTs and connected to the landing structure. The semiconductor structure also includes an insulating layer disposed on the landing structure and having a via. The semiconductor structure also includes a bump disposed on the top surface of the insulating layer and connected to the wiring through the via. The sidewall of the landing structure has a recess in a top view.

20 Claims, 9 Drawing Sheets

(56) References Cited

U.S. PATENT DOCUMENTS

| | | | | |
|---|---|---|---|---|
| 2014/0312390 | A1* | 10/2014 | Tsai | H10D 84/125<br>257/197 |
| 2019/0172773 | A1* | 6/2019 | Kurokawa | H10W 20/43 |
| 2021/0035922 | A1 | 2/2021 | Tokuya | |

* cited by examiner

10b

Da

Db

112

105

112a

106b

112as

110s

106

108

111

108b

106a

108b

104b

106a

100

104a

108a

110

SEMICONDUCTOR STRUCTURE

BACKGROUND OF THE INVENTION

Field of the Invention

The disclosure relates to a semiconductor structure, and more particularly to a heterojunction bipolar transistor bump structure.

Description of the Related Art

A heterojunction bipolar transistor (HBT) is a bipolar junction transistor made of two different materials that have different energy band-gaps. Heterojunction bipolar transistors are widely used in the industry due to their many advantages, which include a low base resistance, a high cut-off frequency, high efficiency, more design flexibility, and a low cost.

Reliability may be affected when forming the bump structure during the HBT packaging process. In addition, the semiconductor structure may also take up too much space.

Although existing heterojunction bipolar transistors have generally been adequate for their intended purposes, they have not been entirely satisfactory in all respects, and need to be improved. This is especially true of the HBT packaging process.

BRIEF SUMMARY OF THE INVENTION

An embodiment of the present invention provides a semiconductor structure including a plurality of heterojunction bipolar transistors (HBT) arranged in parallel and disposed on a substrate. The semiconductor structure also includes a landing structure disposed at the edge of the HBTs on the substrate. The semiconductor structure also includes wiring disposed on the HBTs and connected to the landing structure. The semiconductor structure also includes an insulating layer disposed on the landing structure and having a via. The semiconductor structure also includes a bump disposed on the top surface of the insulating layer. The bump is connected to the wiring through the via. The sidewall of the landing structure has a recess in a top view.

An embodiment of the present invention provides a semiconductor structure including a plurality of HBTs disposed on a substrate. The semiconductor structure also includes wiring disposed on the HBTs. The semiconductor structure also includes a landing structure disposed beside the HBTs on the substrate. The semiconductor structure also includes a bump disposed on the wiring and the landing structure. The semiconductor structure also includes an insulating layer covering a sidewall and a portion of the top surface of the landing structure. The landing structure has a curved surface in top view.

In addition, an embodiment of the present invention provides a semiconductor structure including a plurality of HBTs disposed on the substrate. The semiconductor structure also includes a first dielectric layer deposited on the HBTs and the substrate. The semiconductor structure also includes a landing structure disposed on the first dielectric layer. The semiconductor structure also includes an insulating layer disposed between the HBTs and the landing structure on the substrate. The semiconductor structure also includes wiring disposed on the HBTs. The semiconductor structure also includes a bump disposed over the wiring and the landing structure. The bottom surface of the landing structure is lower than the bottom surface of the wiring.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
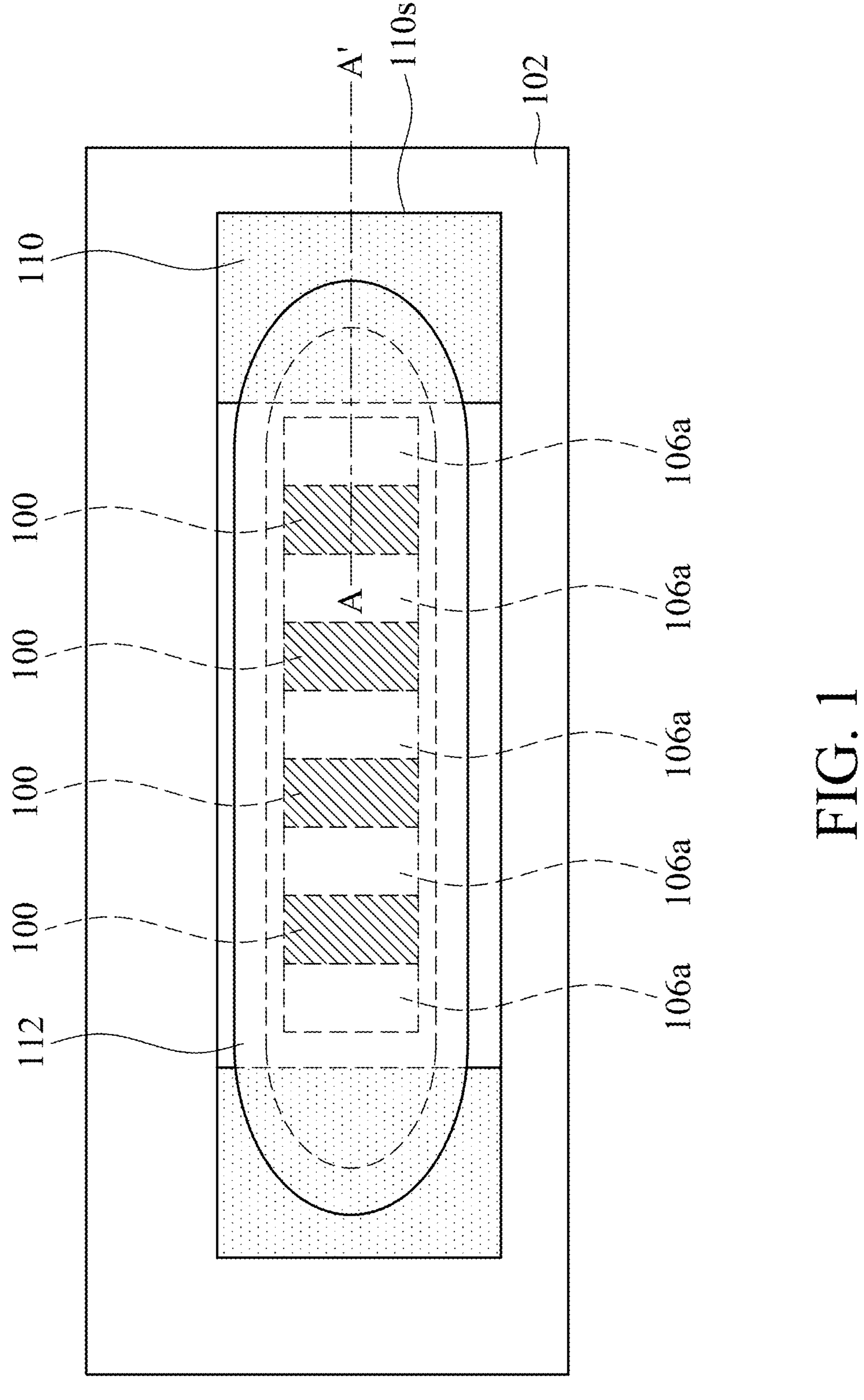
FIG. 1 is a top view of a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Although some embodiments are discussed with operations performed in a particular order, these operations may be performed in another logical order. In different embodiments, additional operations can be provided before, during, and/or after the stages described the present disclosure. Some of the stages that are described can be replaced or eliminated for different embodiments. Additional features can be added to the semiconductor structure in the present disclosure. Some of the features described below can be replaced or eliminated for different embodiments.

The semiconductor device structure may include various active devices. For example, the semiconductor device structure may include HBTs, the semiconductor device structure may also include HEMTs, other suitable devices, and a combination thereof.

The embodiments of the present disclosure provide an HBT. By forming a landing structure with a recess and/or a curved surface in the top view at the edge of the HBT, the reliability may be improved, and the device area may be minimized.

Figure 1A:
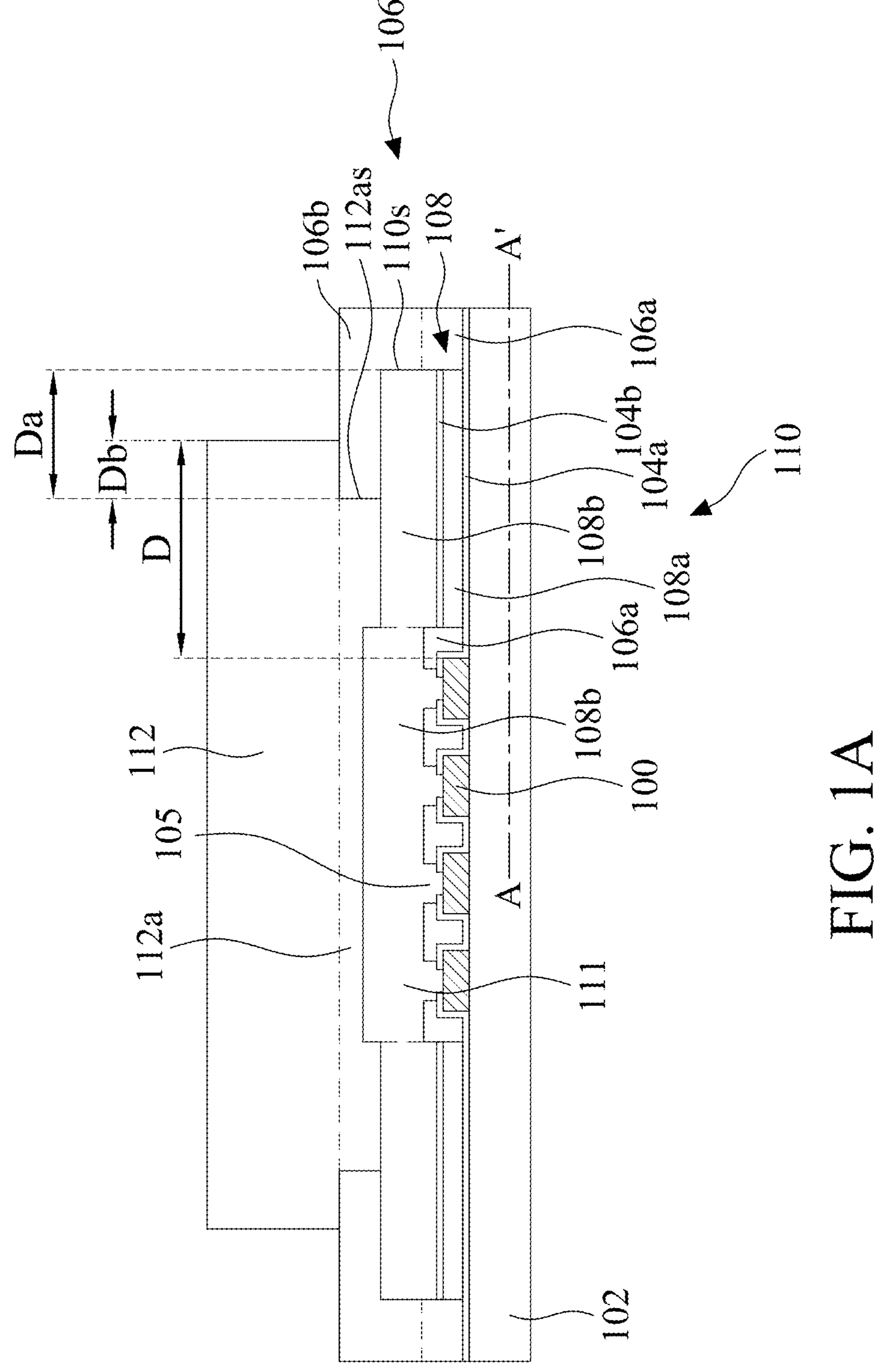
FIG. 1A shows a cross-sectional representation view of a semiconductor structure in accordance with some embodiments.

FIG. 1 is a top view of a semiconductor structure 10*a* in accordance with some embodiments. FIG. 1A shows a cross-sectional representation view of a semiconductor structure 10*a* in accordance with some embodiments. FIG. 1A shows a cross-sectional representation taken along line A-A' in FIG. 1.

HBTs 100 may be formed over a substrate 102, as shown in FIGS. 1 and 1A in accordance with some embodiments. The substrate 102 may be a semiconductor substrate. Moreover, the substrate 102 may include III-V semiconductors such as GaN, AlGaN, AlN, GaAs, AlGaAs, InP, InAlAs, InGaAs, or a combination thereof. In some embodiments, the substrate 102 includes undoped GaAs.

Each of the HBTs 100 includes a collector layer formed over the substrate 102, a base layer formed over the collector layer, and an emitter layer formed over the base layer (not shown).

The collector layer may include a III-V semiconductor having a first conductivity type. The collector layer may include III-V semiconductors such as GaN, AlGaN, AlN, GaAs, AlGaAs, InP, InAlAs, InGaAs, GaSb, InGaP, InGaAsP, or a combination thereof. In some embodiments, the collector layer is an n-type GaAs layer. The collector layer may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

The base layer may include a III-V semiconductor having a second conductivity type. The base layer may include III-V semiconductors such as GaN, AlGaN, AlN, GaAs, AlGaAs, InP, InAlAs, InGaAs, GaSb or a combination thereof. In some embodiments, the base layer is a highly doped p-type GaAs layer which may be doped by C, Mg, Zn, Ca, Be, Sr, Ba, and Ra. The base layer may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

The emitter layer includes a III-V semiconductor having a first conductivity type. The emitter layer may include III-V semiconductors such as GaN, AlGaN, AlN, GaAs, AlGaAs, InP, InAlAs, InGaAs, or a combination thereof. The emitter layer may be an n-type InGaP. The emitter layer may be an AlGaAs layer with a wide band gap. In some embodiments, the emitter layer is an n-type AlGaAs layer. The emitter layer may be a multi-layer structure. The materials of the emitter layer and the base layer are different materials with different band gaps. Therefore, a heterojunction may be formed at the interface between the emitter layer and the base layer. The emitter layer may be formed by molecular-beam epitaxy (MBE), metalorganic chemical vapor deposition (MOCVD), chemical vapor deposition (CVD), hydride vapor phase epitaxy (HVPE), another suitable method, or a combination thereof.

Next, a first dielectric layer 104*a* is conformally deposited over the HBTs 100 and the substrate 102, as shown in FIG. 1A in accordance with some embodiments. The first dielectric layer 104*a* may include $Si_3N_4$, $SiO_2$, $SiO_xN_y$, one or more other suitable dielectric materials, or a combination thereof. The first dielectric layer 104*a* may be formed by low-pressure chemical vapor deposition (LPCVD), plasma enhanced chemical vapor deposition (PECVD), atomic layer deposition (ALD), evaporation, or other suitable methods.

Next, a first conductive layer 108*a* is formed over the first dielectric layer 104*a*, as shown in FIG. 1A in accordance with some embodiments. The first conductive layer 108*a* may include Ti, Al, Au, Pd, Pt, Cu, W, other suitable metal, its alloy, or a combination thereof. The first conductive layer 108*a* may be formed by electroplating, sputtering, resistive heating evaporation, physical vapor deposition (PVD), chemical vapor deposition (CVD), atomic layer deposition (ALD), another suitable method, or a combination thereof.

Later, a second dielectric layer 104*b* is formed over the first conductive layer 108*a*, as shown in FIG. 1A in accordance with some embodiments. The processes and materials for forming the second dielectric layer 104*b* may be the same as, or similar to, those used to form the first dielectric layer 104*a*. For the purpose of brevity, the descriptions of these processes are not repeated herein.

It should be noted that, the first dielectric layer 104*a* and the second dielectric layer 104*b* may be optionally formed. There may be a single dielectric layer or dual dielectric layers.

Afterwards, an opening may be formed exposing the HBTs 100. Later, a first insulating layer 106*a* is formed in the opening covering the HBTs 100, as shown in FIG. 1A in accordance with some embodiments. In some embodiments, the first insulating layer 106*a* is formed between the HBTs 100. The first insulating layer 106*a* may include polybenzoxazole (PBO), benzocyclobutene (BCB), polyimide (PI), other polymers or insulating materials, or a combination thereof. The first insulating layer 106*a* may be formed by metalorganic chemical vapor deposition (MOCVD), chemical vapor deposition (CVD), spin-coating, another suitable method, or a combination thereof.

Next, openings 105 may be formed in the first insulating layer 106*a* and the first dielectric layer 104*a* on the HBTs 100, as shown in FIG. 1A in accordance with some embodiments. A second conductive layer 108*b* is formed in the openings 105 over the HBTs 100 and over the second dielectric layer 104*b*, as shown in FIG. 1A in accordance with some embodiments. In some embodiments, the HBT 100*s* is electrically connected to the second conductive layer 108*b*. The processes for forming the second conductive layer 108*b* may be the same as, or similar to, those used to form the first conductive layer 108*a*. For the purpose of brevity, the descriptions of these processes are not repeated herein.

In some embodiments, the second conductive layer 108*b* and the first conductive layer 108*a* formed at the edge of the HBTs 100 over the substrate 102 are referred as a landing structure 110. The second conductive layer 108*b* formed over the HBTs 100 may be referred as the wiring 111. The first conductive layer 108*a* and the second conductive layer 108*b* may be referred as conductive layers 108. In some embodiments, the first conductive layer 108*a* and the second conductive layer 108*b* are separated by the second dielectric layer 104*b*, but not limited thereto. In some embodiments, the wiring 111 is formed over the HBTs 100 and is connected to the landing structure 110.

Since the second conductive layer 108*b* may be formed of the same material, the boundary between the second conductive layer 108*b* of the wiring 111 and the second conductive layer 108*b* of the landing structure 110 is shown in dashed line, as shown in FIG. 1A in accordance with some embodiments.

It should be noted that, although the width of the first conductive layer 108*a* and the second conductive layer 108*b* of the landing structure 110 are substantially the same in FIG. 1A, the widths of the first conductive layer 108*a* and the second conductive layer 108*b* are not limited thereto. For example, the first conductive layer 108*a* and the second conductive layer 108*b* of the landing structure 110 may have different widths.

In some embodiments, the landing structure 110 is formed on the first dielectric layer 104*a* and is in direct contact with the first dielectric layer 104*a*. In some embodiments, the landing structure 110 is laterally spaced away from the HBTs 100. In some embodiments, the first insulating layer 106*a* is formed between the HBTs 100 and the landing structure 110 on the substrate 102. In some embodiments, the shortest distance between the bottom surface of the landing structure 110 and the substrate 102 is less than the height of the HBTs 100. In some embodiments, the bottom surface of the landing structure 110 is lower than the bottom surface of the wiring 111.

Next, a second insulating layer 106*b* is formed surrounding the landing structure 110 and partially covering the landing structure 110. The processes and materials for forming the second insulating layer 106*b* may be the same as, or similar to, those used to form the first insulating layer 106*a*. For the purpose of brevity, the descriptions of these processes are not repeated herein.

Since the second insulating layer 106*b* and the first insulating layer 106*a* may be formed of the same material, the boundary between the second insulating layer 106*b* and the first insulating layer 106*a* is shown in dashed line, as shown in FIG. 1A in accordance with some embodiments. The second insulating layer 106*b* and the first insulating layer 106*a* may be referred as the insulating layer 106, or there may be only one single insulating layer 106. In some embodiments, the insulating layer 106 covers the sidewall and a portion of the top surface of the landing structure 110.

Next, via may be formed in the second insulating layer 106*b* over the HBTs 100. A bump 112 may be formed in the via over the HBTs 100 and over the insulating layer 106*a*, as shown in FIG. 1A in accordance with some embodiments. In some embodiments, the bump 112 is formed over the wiring 111 and the landing structure 110. The bump 112 is then patterned to expose a portion of the insulating layer 106. The bump 112 formed in the via over the HBTs 100 may be referred as a connecting portion 112*a*. In some embodiments, the bump 112 is formed over the top surface of the insulating layer 106 and is connected to the wiring 111 through the connecting portion 112*a*.

The bump 112 may include Cu, Ti, Al, Au, Pd, Pt, W, other suitable metal, its alloy, or a combination thereof. The bump 112 may be formed by electroplating, sputtering, resistive heating evaporation, physical vapor deposition (PVD), chemical vapor deposition (CVD), atomic layer deposition (ALD), another suitable method, or a combination thereof. Since the bump 112 and the connecting portion 112*a* may be formed of the same material, the boundary of the connecting portion 112*a* is shown in dashed line, as shown in FIG. 1A in accordance with some embodiments.

In some embodiments, the distance D between the HBTs 100 and the edge of the bump 112 is greater than 12 μm. If the distance D is too short, the reliability may be worse.

In some embodiments, the bump 112 extends out of the sidewall 112 as of the connecting portion 112*a* by a distance Db, and the sidewall 110*s* of the landing structure 110 extends out of the sidewall 112 as of the connecting portion 112*a* by a distance Da. In some embodiments, the distance Da is greater than or substantially equal to the distance Db. In some embodiments, the edge of the bump 112 is within the landing structure 110 in a top view, as shown in FIG. 1 in accordance with some embodiments. The reliability may be improved.

In some embodiments, the insulating layer 106 is further formed between the landing structure 110 and the bump 112, as shown in FIG. 1A in accordance with some embodiments. In some embodiments, a portion of the top surface of the insulating layer 106 is covered by the bump 112. In some embodiments, the insulating layer 106 is extended to cover a sidewall 110*s* of the landing structure 110. In some embodiments, the landing structure 110 is covered by the bump 112 and the insulating layer 106 and is not exposed. The chemicals used in the following processes may not damage the landing structure 110.

However, since the landing structure 110 is only formed at the edge of the HBTs 100, as shown in FIG. 1 in accordance with some embodiments, the insulating layer 106 (the first insulating layer 106*a*) may extend from the sidewall of the HBTs 100 to the edge of the substrate 102 in other cross-sectional views.

In some embodiments, the bump 112 is in direct contact with the wiring 111 and the landing structure 110. In some embodiments, the bottom surface of the bump 112 on the wiring 111 is higher than the bottom surface of the bump 112 on the landing structure 110. In some embodiments, the top surface of the wiring 111 is higher than the top surface of the landing structure 110.

By forming the landing structure 110 at the edge of the HBTs 100 in the insulating layer 106, the reliability of the HBTs 100 may be improved.

Figures 2, 2A:
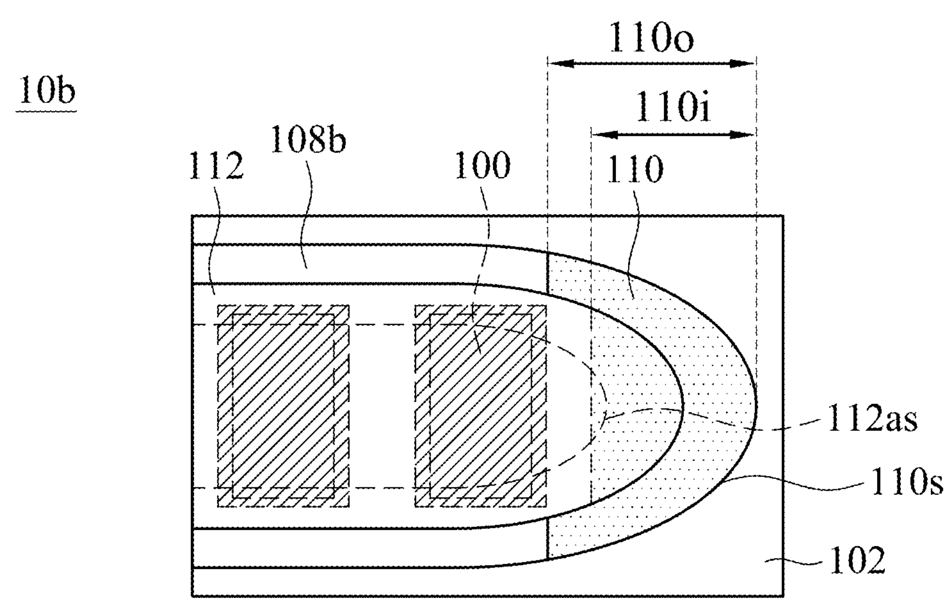
FIG. 2 is an enlarged top view of a semiconductor structure in accordance with some embodiments.
FIG. 2A shows an enlarged cross-sectional representation view of a semiconductor structure in accordance with some embodiments.

Many variations and/or modifications may be made to the embodiments of the disclosure. FIG. 2 is an enlarged top view of a semiconductor structure 10*b* in accordance with some embodiments. Some processes or devices are the same as, or similar to, those described in the embodiments above, and therefore the descriptions of these processes and devices are not repeated herein. The difference from the embodiments described above is that, as shown in FIG. 2 in accordance with some other embodiments, the landing structure 110 has a recess and/or a curved surface in a top view.

In some embodiments, the landing structure 110 has a concave surface at the side near the HBTs 100. In some embodiments, one of the HBTs 100 is formed in the recess of the landing structure 110 in the top view.

The shape of the landing structure 110 may be defined by the patterning process. The landing structure 110 with a recess and/or a curved surface may minimize the area of the landing structure 110, which may improve the space availability. In addition, the recess may optimize the space, and more HBTs 100 may be placed.

In some embodiments as shown in FIG. 2, the landing structure 110 has an inner width 110*i* and an outer width 1100. In some embodiments as shown in FIGS. 2 and 2A, the inner width 110*i* is smaller than the outer width 1100. In some embodiments, the distance Db of the bump 112 extending out of the edge of the connecting portion 112*a* is within the range of the inner width 110*i* of the landing structure 110. In some embodiments, the distance Da of landing structure 110 extending out of the edge of the connecting portion 112*a* is within the range of the outer width 1100 of the landing structure 110.

By forming the landing structure 110 at the edge of the HBTs 100 in the insulating layer 106, the reliability of the HBTs 100 may be improved. The sidewall 110*s* of the landing structure 110 may have a recess and/or a curved surface in a top view.

Many variations and/or modifications may be made to the embodiments of the disclosure. FIGS. 3-7 are enlarged top views of a semiconductor structure 10*c*~10*g* in accordance with some embodiments, respectively. Some processes or devices are the same as, or similar to, those described in the embodiments above, and therefore the descriptions of these processes and devices are not repeated herein. The difference from the embodiments described above is that, as shown in FIGS. 3-7 in accordance with some other embodiments, the shapes of the landing structure 110 are different in the top view.

In some embodiments, the landing structure 110 has an inner sidewall facing the HBTs 100 and an outer sidewall on the opposite side.

Figure 3:
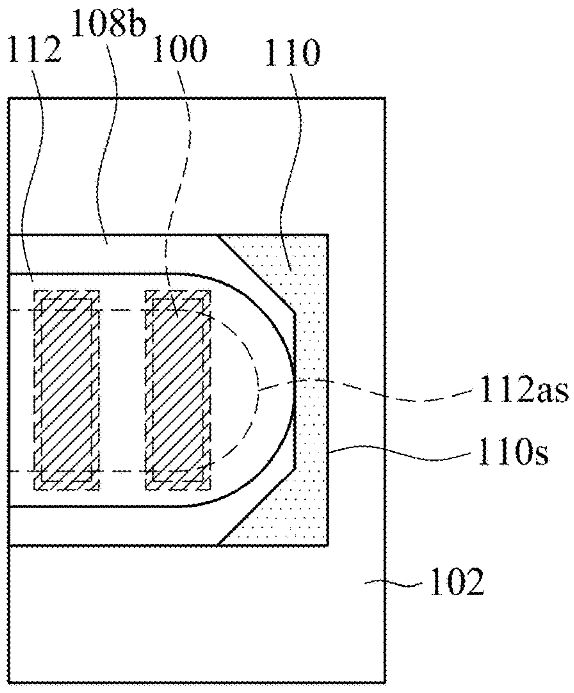
FIG. 3 is an enlarged top view of a semiconductor structure in accordance with some embodiments.
Figure 4:
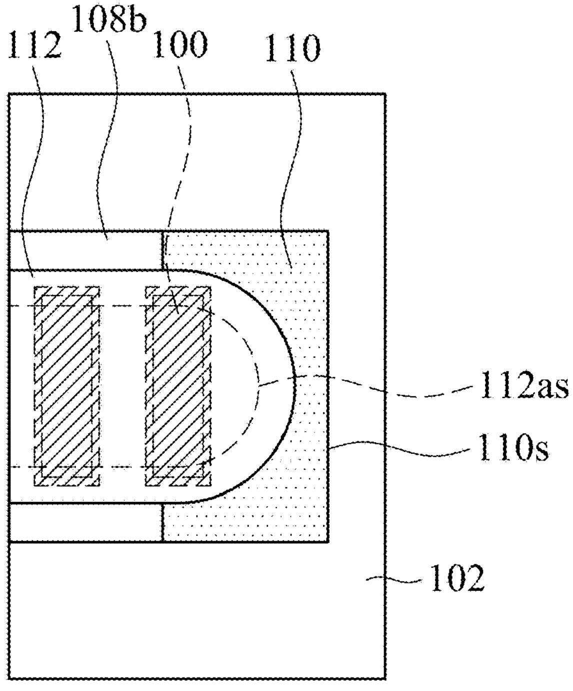
FIG. 4 is an enlarged top view of a semiconductor structure in accordance with some embodiments.
Figure 5:
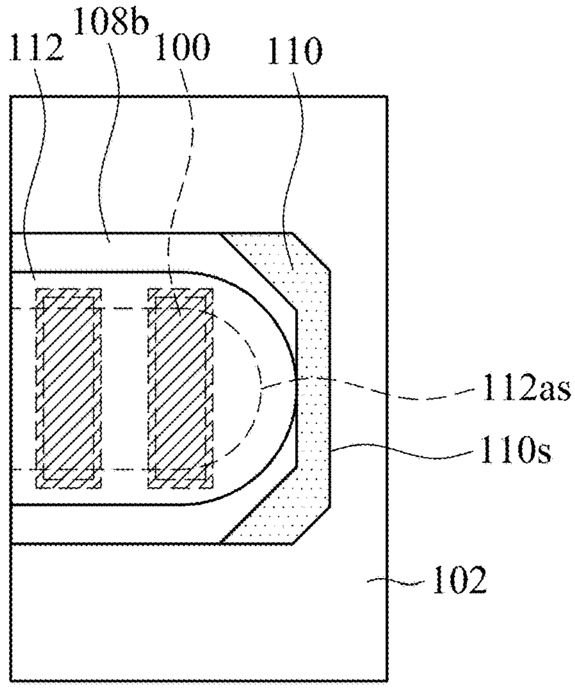
FIG. 5 is an enlarged top view of a semiconductor structure in accordance with some embodiments.
Figure 6:
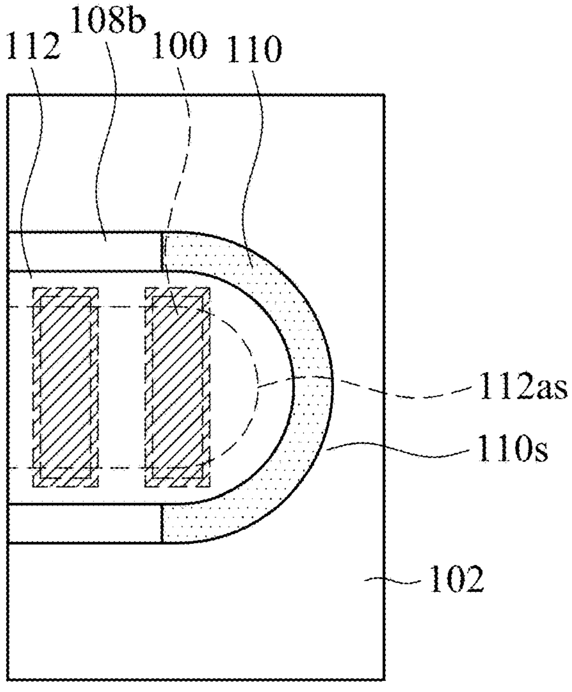
FIG. 6 is an enlarged top view of a semiconductor structure in accordance with some embodiments.
Figure 7:
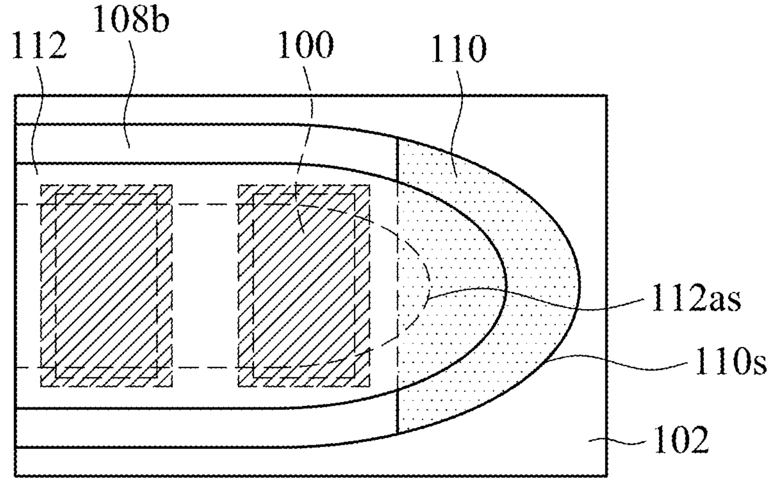
FIG. 7 is an enlarged top view of a semiconductor structure in accordance with some embodiments.

For example, the landing structure 110 of the semiconductor structure 10*c* has a straight outer sidewall and an inner sidewall with bevel corners in the top view, as shown in FIG. 3 in accordance with some embodiments. The landing structure 110 of the semiconductor structure 10*d* has a straight outer sidewall and a curved inner sidewall in the top view, as shown in FIG. 4 in accordance with some embodiments. Both of the outer sidewall and the inner sidewall of the landing structure 110 of the semiconductor structure 10*e* have bevel corners, as shown in FIG. 5 in accordance with some embodiments. Both of the outer sidewall and the inner sidewall of the landing structure 110 of the semiconductor structure 10*f* have curved surface, as shown in FIG. 6 in accordance with some embodiments. The landing structure 110 of the semiconductor structure 10*g* has a straight inner sidewall and a curved outer sidewall in the top view, as shown in FIG. 7 in accordance with some embodiments.

The shape of the landing structure 110 may be defined by the patterning process, depending on the needs of design and process. Different shapes of the landing structure 110 may provide design and process flexibility By forming the landing structure 110 at the edge of the HBTs 100 in the insulating layer 106, the reliability of the HBTs 100 may be improved. The sidewall 110*s* of the landing structure 110 may have different shapes in a top view, which may provide more design and process flexibility.

Many variations and/or modifications may be made to the embodiments of the disclosure. FIGS. 8-12 are enlarged top views of a semiconductor structure 10*h*~10*l* in accordance with some embodiments, respectively. Some processes or devices are the same as, or similar to, those described in the embodiments above, and therefore the descriptions of these processes and devices are not repeated herein. The difference from the embodiments described above is that, as shown in FIGS. 8-12 in accordance with some other embodiments, the shapes of the landing structure 110 are asymmetric in the top view.

The landing structure 110 of the semiconductor structure 10*h*~10*l* have an extending structure 110*e* extends toward the HBTs 100, as shown in FIGS. 8-12 in accordance with some embodiments. In some embodiments, the landing structure 110 may have an inner sidewall facing the HBTs 100 and an outer sidewall on the opposite side.

Figure 8:
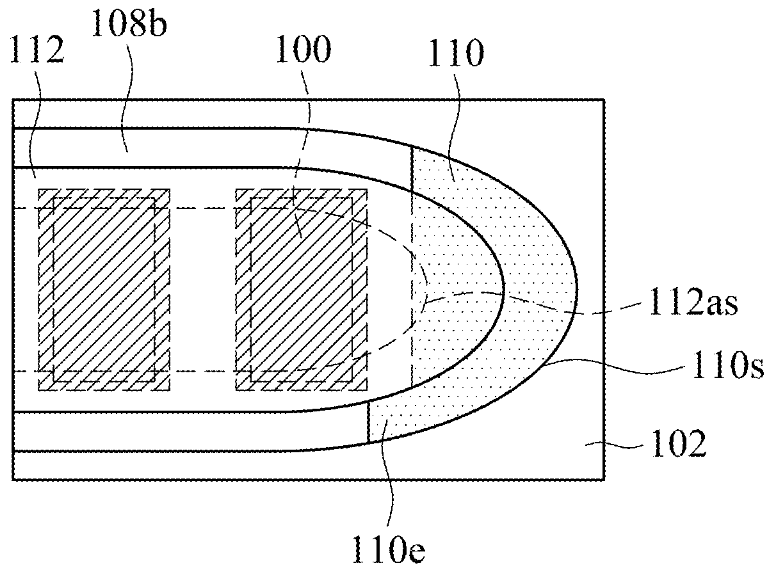
FIG. 8 is an enlarged top view of a semiconductor structure in accordance with some embodiments.
Figure 9:
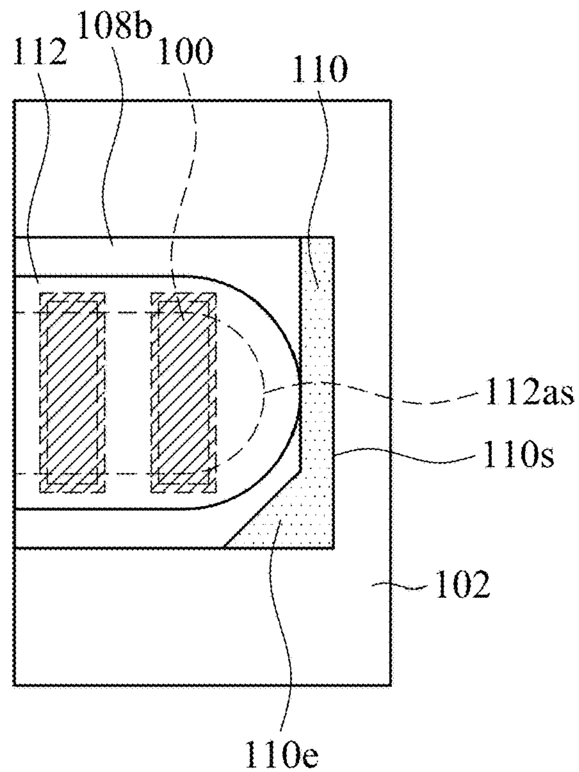
FIG. 9 is an enlarged top view of a semiconductor structure in accordance with some embodiments.
Figure 10:
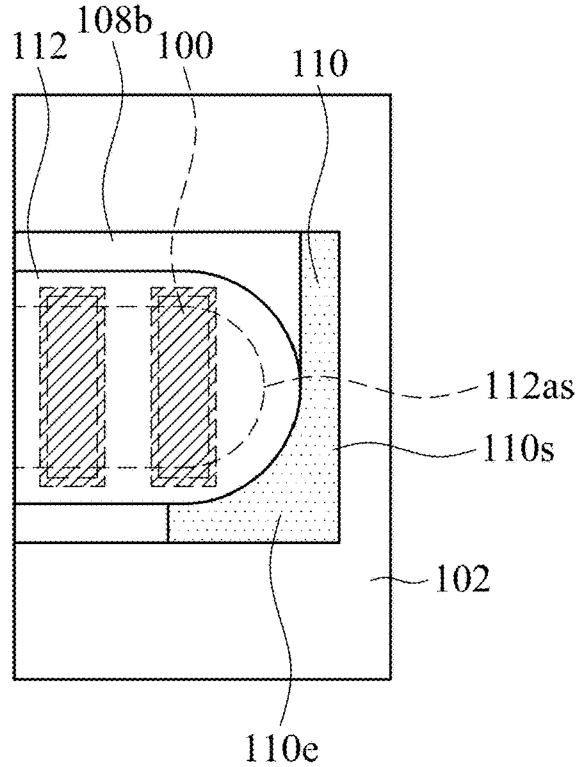
FIG. 10 is an enlarged top view of a semiconductor structure in accordance with some embodiments.
Figure 11:
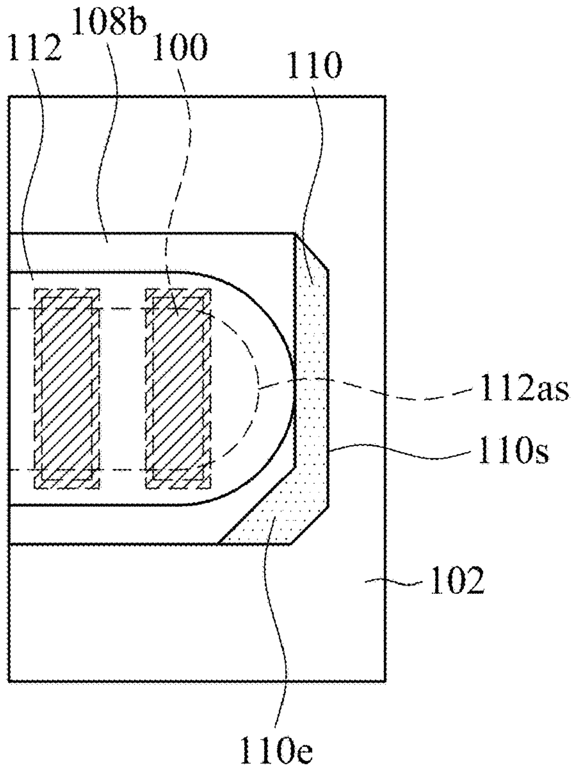
FIG. 11 is an enlarged top view of a semiconductor structure in accordance with some embodiments.
Figure 12:
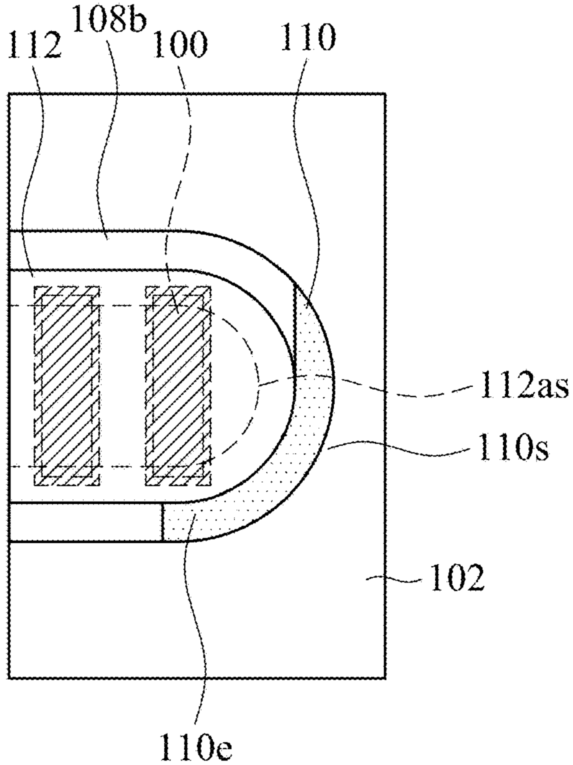
FIG. 12 is an enlarged top view of a semiconductor structure in accordance with some embodiments.

The landing structure 110 of the semiconductor structure 10*h* has an asymmetric straight inner sidewall and a curved outer sidewall in the top view, as shown in FIG. 8 in accordance with some embodiments. The landing structure 110 of the semiconductor structure 10*i* has a straight outer sidewall and an asymmetric inner sidewall with bevel corners in the top view, as shown in FIG. 9 in accordance with some embodiments. The landing structure 110 of the semiconductor structure 10*j* has a straight outer sidewall and a curved asymmetric inner sidewall in the top view, as shown in FIG. 10 in accordance with some embodiments. Both of the outer sidewall and the asymmetric inner sidewall of the landing structure 110 of the semiconductor structure 10*k* have bevel corners, as shown in FIG. 11 in accordance with some embodiments. Both of the outer sidewall and the asymmetric inner sidewall of the landing structure 110 of the semiconductor structure 10*l* have curved surface, as shown in FIG. 12 in accordance with some embodiments.

The asymmetric shape of the landing structure 110 may be defined by the patterning process, depending on the needs of design and process. Different asymmetric shapes of the landing structure 110 may provide design and process flexibility By forming the landing structure 110 at the edge of the HBTs 100 in the insulating layer 106, the reliability of the HBTs 100 may be improved. The sidewall 110*s* of the landing structure 110 may have different asymmetric shapes in a top view, which may provide more design and process flexibility.

Figure 13:
FIG. 13 shows an enlarged cross-sectional representation view of a semiconductor structure in accordance with some embodiments.
Figure 13:
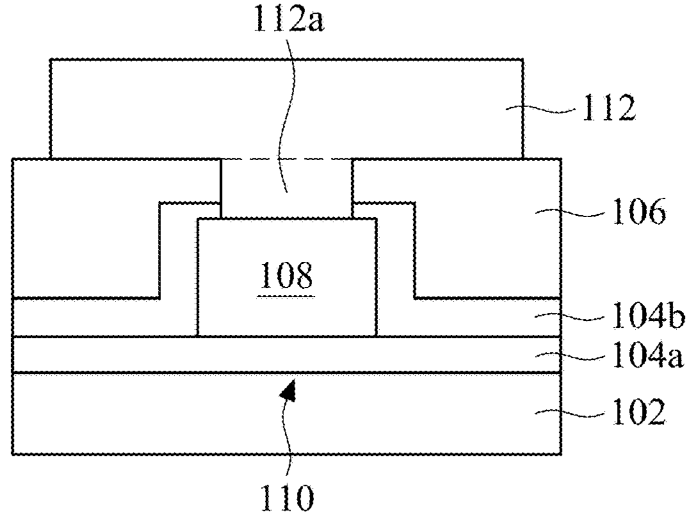
Figure 14:
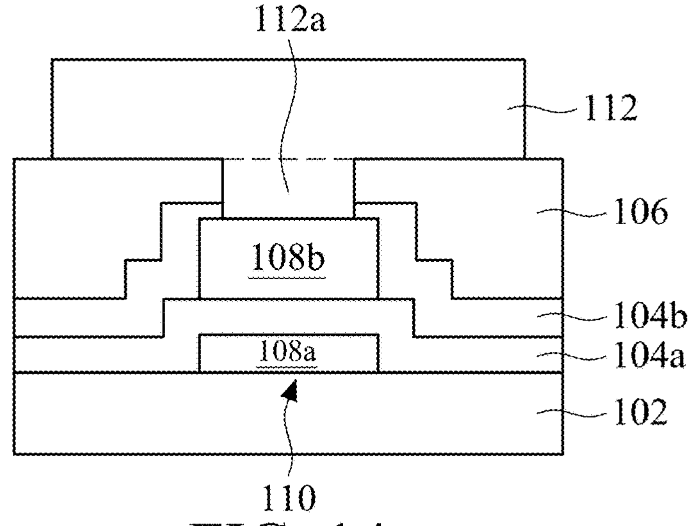
FIG. 14 shows an enlarged cross-sectional representation view of a semiconductor structure in accordance with some embodiments.
Figure 15:
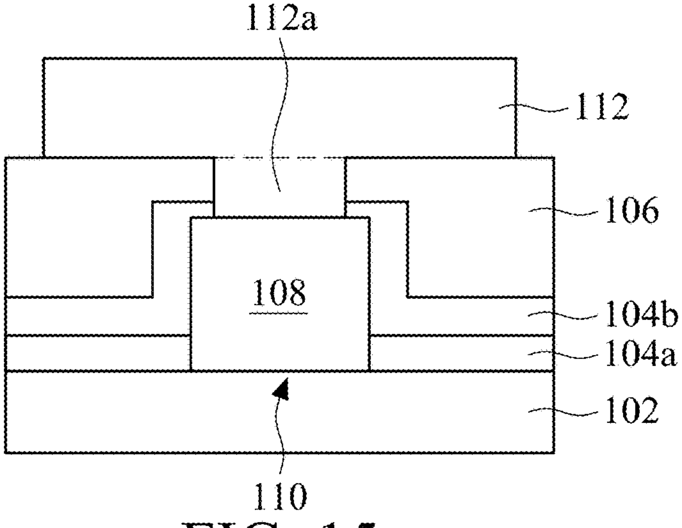
FIG. 15 shows an enlarged cross-sectional representation view of a semiconductor structure in accordance with some embodiments.

Many variations and/or modifications may be made to the embodiments of the disclosure. FIGS. 13-15 are enlarged cross-sectional views of semiconductor structures 10*m*~10*o* in accordance with some embodiments, respectively. Some processes or devices are the same as, or similar to, those described in the embodiments above, and therefore the descriptions of these processes and devices are not repeated herein. The difference from the embodiments described above is that, as shown in FIGS. 13-15 in accordance with some other embodiments, there may be various arrangements of the dielectric layers 104*a* and 104*b* and the conductive layers 108*a* and 108*b*.

FIGS. 13-15 show enlarged cross-sectional representation views of the landing structure 110 in accordance with some embodiments.

For example, the conductive layer 108 of the semiconductor structure 10*m* is formed over the first dielectric layer 104*a*, as shown in FIG. 13 in accordance with some embodiments. In some embodiments, the conductive layer 108 is in direct contact with the first dielectric layer 104*a*. The conductive layer 108 is connected to the connecting portion 112*a* of the bump 112. In some embodiments, the second dielectric layer 104*b* covers at least a portion of the sidewall and a portion of the top surface of the conductive layers 108. In some embodiments, the second dielectric layer 104*b* is formed over the first dielectric layer 104*a*, and the landing structure 110 is in direct contact with the second dielectric layer 104*b*.

In some embodiments as shown in FIG. 14, the first conductive layer 108*a* of the semiconductor structure 10*n* is formed over the substrate 102 and is covered by the first dielectric layer 104*a*. The first dielectric layer 104*a* may be formed between the conductive layers 108*a* and 108*b*. The first conductive layer 108*a* is in direct contact with the substrate 102 and the first dielectric layer 104*a*. In some embodiments, the first dielectric layer 104*a* covers the sidewall and the top surface of the first conductive layer 108*a*. The second conductive layer 108*b* is formed over the first dielectric layer 104*a* and is connected to the connecting portion 112*a* of the bump 112. In some embodiments, the second dielectric layer 104*b* covers the sidewall and a portion of the top surface of the second conductive layer 108*b*. In some embodiments, the landing structure 110 includes multiple conductive layers 108*a* and 108*b* and multiple dielectric layers 104*a* and 104*b* formed between and over the conductive layers 108*a* and 108*b*.

In some embodiments as shown in FIG. 15, the conductive layer 108 of the semiconductor structure 10*o* is formed over the substrate 102 and is covered by the second dielectric layer 104*b*. The conductive layer 108 is in direct contact with the substrate 102, the first dielectric layer 104*a*, and the second dielectric layer 104*b*. The conductive layer 108 is connected to the connecting portion 112*a* of the bump 112. In some embodiments, the first dielectric layer 104*a* and the second dielectric layer 104*b* cover the sidewall of the conductive layer 108. In some embodiments, the landing structure 110 is in direct contact with the substrate 102.

By forming the landing structure 110 at the edge of the HBTs 100 in the insulating layer 106, the reliability of the HBTs 100 may be improved. The landing structure 110 with a recess and/or a curved surface may further minimize the area of the landing structure 110, which may improve the space availability. The conductive layers 108 and the dielectric layers 104*a* and 104*b* may be arranged in different ways, depending on the process needs.

As mentioned above, in the present disclosure, a landing structure is formed over the substrate at the edge of the HBT. The reliability may be improved. By modifying the shape of the landing structure in the top view, the area may be saved, and more process and design flexibility is provided.

It should be noted that although some of the benefits and effects are described in the embodiments above, not every embodiment needs to achieve all the benefits and effects.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
- a plurality of heterojunction bipolar transistors (HBT) arranged in parallel and disposed on a substrate;
- a landing structure disposed at the edge of the HBTs on the substrate;
- wiring disposed on the HBTs and connected to the landing structure;
- an insulating layer disposed on the landing structure and having a via;
- a bump disposed on the top surface of the insulating layer and connected to the wiring through the via,
- wherein a sidewall of the landing structure has a recess in a top view.

2. The semiconductor structure as claimed in claim 1, wherein the insulating layer is extended to cover a sidewall of the landing structure.

3. The semiconductor structure as claimed in claim 1, further comprising:
- a first dielectric layer disposed on the substrate covering the HBTs.

4. The semiconductor structure as claimed in claim 3, wherein the landing structure is disposed on the first dielectric layer and in contact with the first dielectric layer.

5. The semiconductor structure as claimed in claim 1, wherein the landing structure comprises a plurality of metal layers and a plurality of dielectric layers disposed between the metal layers.

6. The semiconductor structure as claimed in claim 5, wherein the dielectric layers cover a portion of a sidewall of the metal layers.

7. The semiconductor structure as claimed in claim 1, wherein one of the HBTs is disposed in the recess in the top view.

8. A semiconductor structure, comprising:
- a plurality of HBTs disposed on a substrate;
- wiring disposed on the HBTs;
- a landing structure disposed beside the HBTs on the substrate;
- a bump disposed on the wiring and the landing structure;
- an insulating layer covering a sidewall and a portion of the top surface of the landing structure,
- wherein the landing structure has a curved surface in top view.

9. The semiconductor structure as claimed in claim 8, wherein the landing structure is laterally spaced away from the HBT.

10. The semiconductor structure as claimed in claim 8, wherein the insulating layer comprises polybenzoxazole (PBO).

11. The semiconductor structure as claimed in claim 8, wherein a shortest distance between the bottom surface of the landing structure and the substrate is less than a height of the HBT.

12. The semiconductor structure as claimed in claim 8, wherein the HBT comprises:
- a collector layer disposed on the substrate;
- a base layer disposed on the collector layer; and
- an emitter layer disposed on the base layer.

13. The semiconductor structure as claimed in claim 8, wherein the bump is in direct contact with the wiring and the landing structure, wherein a bottom surface of the bump on the wiring is higher than the bottom surface of the bump on the landing structure.

14. A semiconductor structure, comprising:

a plurality of HBTs disposed on the substrate;

a first dielectric layer deposited on the HBTs and the substrate;

a landing structure disposed on the first dielectric layer;

an insulating layer disposed between the HBTs and the landing structure on the substrate;

wiring disposed on the HBTs; and a bump disposed over the wiring and the landing structure, wherein a bottom surface of the landing structure is lower than a bottom surface of the wiring.

15. The semiconductor structure as claimed in claim 14, wherein a portion of a top surface of the insulating layer is covered by the bump.

16. The semiconductor structure as claimed in claim 14, further comprising:

a second dielectric layer disposed over the first dielectric layer, wherein the landing structure is in direct contact with the second dielectric layer.

17. The semiconductor structure as claimed in claim 14, wherein the landing structure comprises a plurality of metal layers.

18. The semiconductor structure as claimed in claim 14, wherein the landing structure is in direct contact with the substrate.

19. The semiconductor structure as claimed in claim 14, wherein the landing structure is in direct contact with the first dielectric layer.

20. The semiconductor structure as claimed in claim 14, wherein the insulating layer is further disposed between the landing structure and the bump.

* * * * *